(12) United States Patent
Zhang et al.

(10) Patent No.: US 9,054,308 B1
(45) Date of Patent: Jun. 9, 2015

(54) PLASMA REDUCTION METHOD FOR MODIFYING METAL OXIDE STOICHIOMETRY IN RERAM

(71) Applicant: SanDisk 3D LLC, Mitpitas, CA (US)

(72) Inventors: Tong Zhang, Palo Alto, CA (US); Timothy James Minvielle, San Jose, CA (US); Chu-Chen Fu, San Ramon, CA (US); Wipul Jayasekara, Los Gatos, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/196,647

(22) Filed: Mar. 4, 2014

(51) Int. Cl.
*H01L 21/00* (2006.01)
*H01L 21/16* (2006.01)
*H01L 47/00* (2006.01)
*H01L 45/00* (2006.01)

(52) U.S. Cl.
CPC .......... *H01L 45/1641* (2013.01); *H01L 45/145* (2013.01); *H01L 45/1608* (2013.01)

(58) Field of Classification Search
USPC .................. 438/104, 381; 257/1–8
See application file for complete search history.

(56) References Cited

U.S. PATENT DOCUMENTS

| | | | |
|---|---|---|---|
| 3,429,691 A | 2/1969 | McLaughlin | |
| 4,311,520 A | 1/1982 | Kruesi et al. | |
| 6,080,283 A * | 6/2000 | Ray | 204/164 |
| 6,946,401 B2 | 9/2005 | Huang et al. | |
| 6,972,071 B1 | 12/2005 | Tyler | |
| 8,021,723 B2 | 9/2011 | Fukasawa et al. | |
| 2009/0283736 A1 * | 11/2009 | Kanzawa et al. | 257/2 |
| 2009/0302296 A1 * | 12/2009 | Fuchigami et al. | 257/2 |
| 2011/0193050 A1 * | 8/2011 | Takano et al. | 257/4 |
| 2013/0130464 A1 * | 5/2013 | Lee et al. | 438/381 |

OTHER PUBLICATIONS

Lyubochko et al., "Reduction of aluminium oxide in a nonequilibrium hydrogen plasma," J. Eng. Physics and Thermophysics, May-Jun. 2000, vol. 73, Issue 3, pp. 568-572.

Maki, et al., "Effect of hydrogen plasma treatment on reduction process of iron oxide nanoparticles," J. of Physics Conference Series, Jan. 2011, 266(1), 6 pages.

Baklanov, et al., "Characterization of Cu surface cleaning by hydrogen plasma," J. Vac. Sci. Technology, B19, Jul./Aug. 2001, 11 pages.

(Continued)

*Primary Examiner* — Karen Kusumakar
(74) *Attorney, Agent, or Firm* — Vierra Magen Marcus LLP

(57) ABSTRACT

A fabrication process for a resistance-switching memory cell uses metal oxide as a resistance-switching material. A metal oxide film having an initial stoichiometry is deposited on an electrode using atomic layer deposition. A changed stoichiometry is provided for a portion of the metal oxide film using a plasma reduction process, separate from the atomic layer deposition, and another electrode is formed adjacent to the changed stoichiometry portion. The film deposition and the plasma reduction can be performed in separate chambers where conditions such as temperature are optimized. The metal oxide film may be deposited on a vertical sidewall in a vertical bit line 3*d* memory device. Optionally, the mean free path of hydrogen ions during the plasma reduction process is adjusted to increase the uniformity of the vertical metal oxide film. The adjustment can involve factors such as RF power, pressure and a bias of the wafer.

19 Claims, 10 Drawing Sheets

(56) References Cited

OTHER PUBLICATIONS

F. Brecelj, et al., "Reduction of metal oxide thin layers by hydrogen plasma," Selected Proceedings of the Yugoslav-Austrian-Hungarian Fourth Joint Vacuum Conference, vol. 40, Issues 1-2, 1990, pp. 177-178.

Chen, et al., "Hydrogen-Induced Resistive Switching in TiN/ALD HfO2/PEALD TiN RRAM Device," IEEE Electron Device Letters, vol. 33, No. 4, Apr. 2012, pp. 483-485.

* cited by examiner

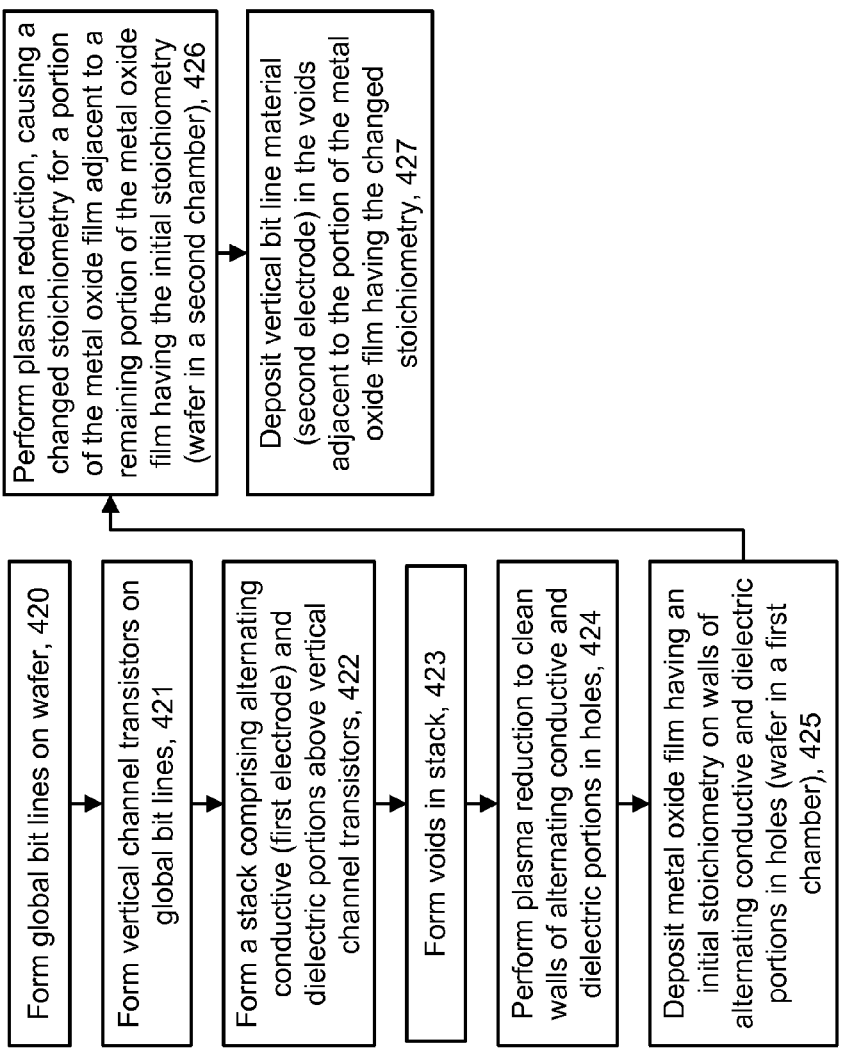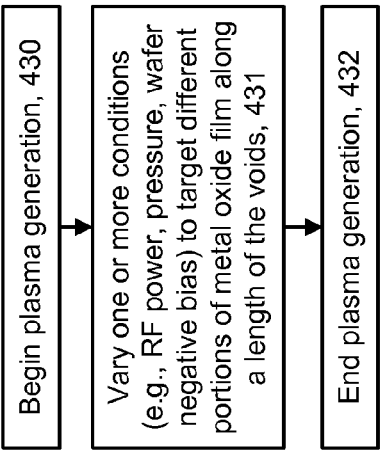

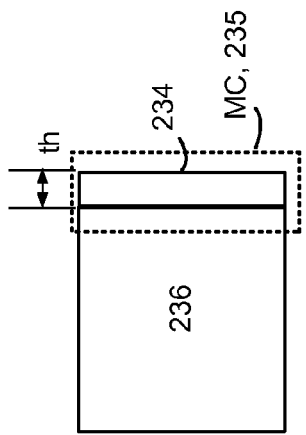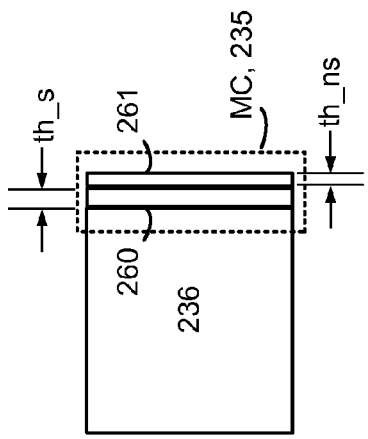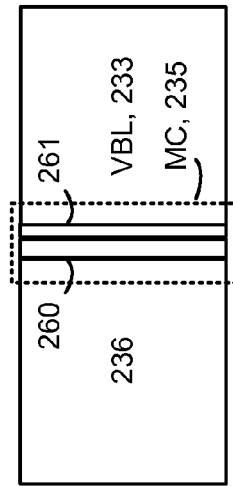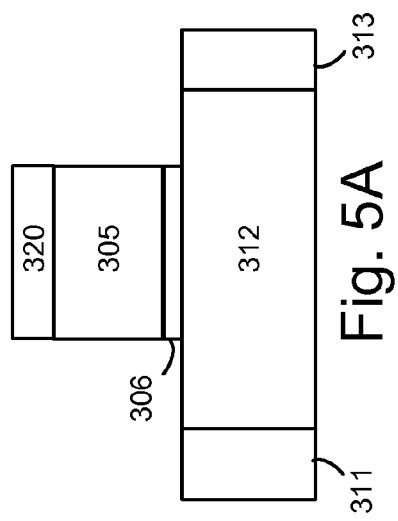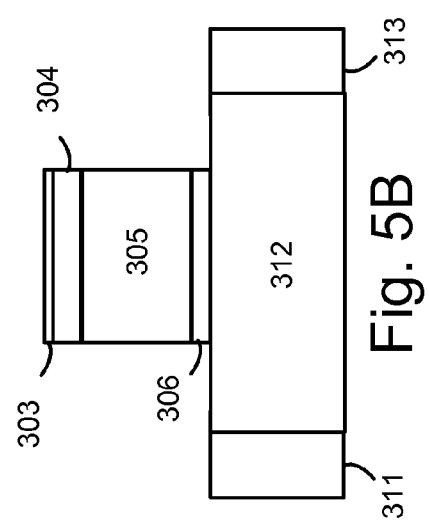

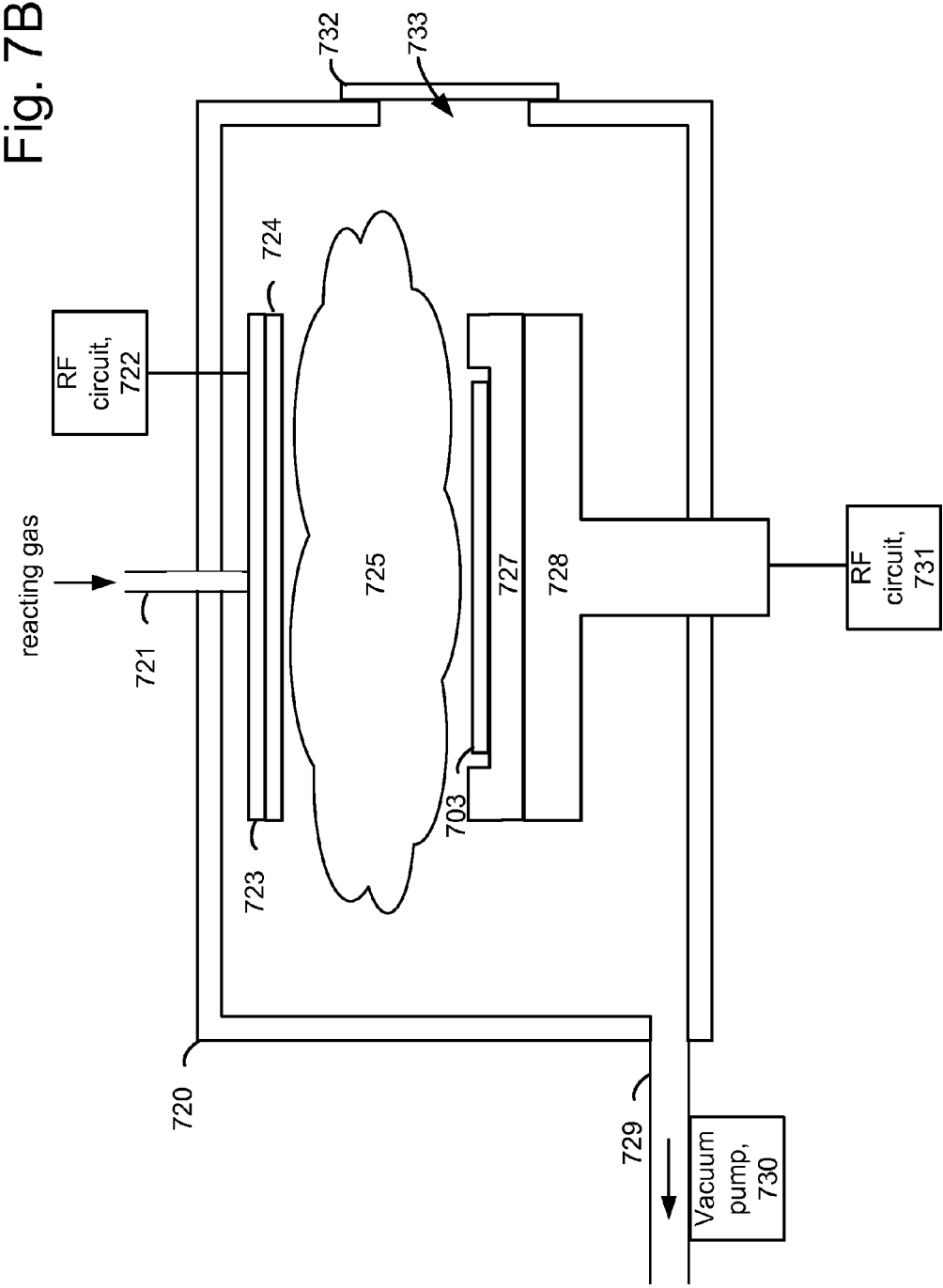

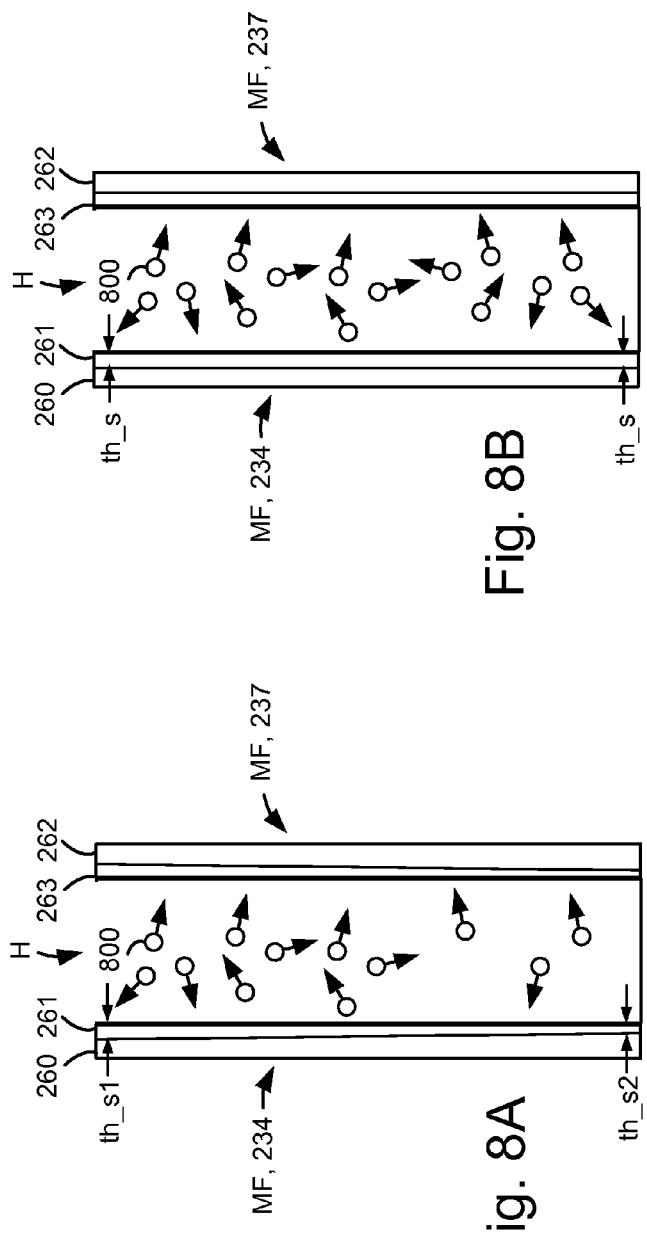
Fig. 8A
Fig. 8B
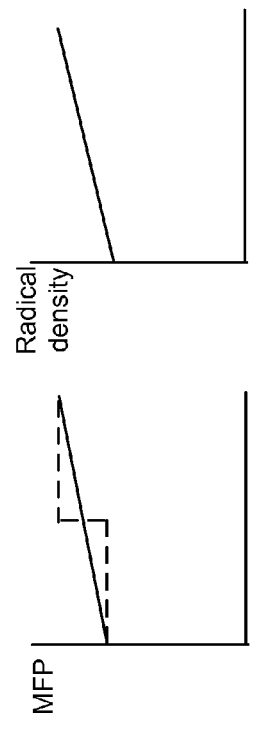
Fig. 8C
Fig. 8D
Fig. 8E
Fig. 8F

PLASMA REDUCTION METHOD FOR MODIFYING METAL OXIDE STOICHIOMETRY IN RERAM

BACKGROUND

The present technology relates to data storage.

A variety of materials show reversible resistance-change or resistance-switching behavior in which the resistance of the material is a function of the history of the current through, and/or voltage across, the material. A resistance-switching element comprising one of these materials may be formed in an initial state, for example, a relatively low-resistance state. Upon application of sufficient voltage, the material switches to a stable high-resistance state which is maintained even after the voltage is removed. This resistance switching is reversible such that subsequent application of an appropriate current or voltage can serve to return the resistance-switching element to a stable low-resistance state which is maintained even after the voltage or current is removed. This conversion can be repeated many times. For some materials, the initial state is high-resistance rather than low-resistance. A set process may refer to switching the material from high to low resistance, while a reset process may refer to switching the material from low to high resistance. A resistance-switching memory cell can include a resistance-switching element positioned between first and second electrodes.

These reversible resistance-change materials, also referred to as read-write (RW) materials, are of interest for use in nonvolatile memory arrays. One resistance state may correspond to a data "0," for example, while the other resistance state corresponds to a data "1." Some of these materials may have more than two stable resistance states. Moreover, in a resistance-switching memory cell, the resistance-switching element can be in series with a steering element such as a diode or transistor, which selectively limits the voltage across, and/or the current flow through, the resistance-switching element. For example, a diode can allow current to flow in only one direction of the resistance-switching element while essentially preventing a current flow in the opposite direction. Such a steering element itself is not typically a resistance-change material. Instead, the steering element allows a resistance-switching memory cell to be written to, and/or read from, without affecting the state of other memory cells in an array.

However, there is a continuing need to advance the development of reversible resistance-change materials.

BRIEF DESCRIPTION OF THE DRAWINGS

FIG. 4C depicts an example implementation of the process of FIG. 4A for fabricating the memory cell of FIG. 2.

FIG. 4D depicts an example implementation of step 426 of FIG. 4C for performing plasma reduction.

FIG. 5A depicts a fabrication stage of the memory cell of FIG. 3 in which a stoichiometric metal oxide film 320 is deposited on a lower conductive material, consistent with steps 410 to 412 of FIG. 4B.

FIG. 5B depicts a fabrication stage of the memory cell of FIG. 3 in which a changed stoichiometry portion 303 of the metal oxide film 320 is formed above a remaining initial stoichiometry portion 304 of the metal oxide film 320, consistent with step 413 of FIG. 4B.

FIG. 6A depicts a fabrication stage of the memory cell 235 of FIG. 2 in which a stoichiometric metal oxide film 234 is deposited on walls of alternating conductive and dielectric portions in holes in the stack, consistent with step 425 of FIG. 4C.

FIG. 6B depicts a fabrication stage of the memory cell 235 of FIG. 2 in which a changed stoichiometry portion 261 of the metal oxide film 234 is formed adjacent to a remaining initial stoichiometry portion 260 of the metal oxide film, consistent with step 426 of FIG. 4C.

FIG. 6C depicts a fabrication stage of the memory cell 235 of FIG. 2 in which a vertical bit line material is deposited adjacent to the changed stoichiometry portion 261 of the metal oxide film 234, consistent with step 427 of FIG. 4C.

FIG. 7B depicts a chamber in which a plasma reduction process is performed on a stoichiometric metal oxide film, consistent with step 401 of FIG. 4A, step 413 of FIG. 4B and step 426 of FIG. 4C.

FIG. 8A depicts an uneven formation of the changed stoichiometry portion of a metal oxide film which can result during a plasma reduction process of step 426 of FIG. 4C.

FIG. 8B depicts an even formation of the changed stoichiometry portion of a metal oxide film which results during the plasma reduction process of step 426 of FIG. 4C by varying the process conditions as set forth in step 431 of FIG. 4D.

FIG. 8C is a plot showing a variation of mean free path as a function of plasma reduction time, where process conditions are varied consistent with step 431 of FIG. 4D.

FIG. 8D is a plot showing a variation of reduction plasma radical density as a function of radio frequency (RF) power, consistent with step 431 of FIG. 4D.

FIG. 8E is a plot showing a variation of mean free path as a function of pressure, consistent with step 431 of FIG. 4D.

FIG. 8F is a plot showing a variation of reduction plasma radical energy as a function of a bias on a wafer, consistent with step 431 of FIG. 4D.

DETAILED DESCRIPTION

The present technology relates to a resistance-change memory cell and to a corresponding fabrication process for providing such a cell.

As mentioned, there is a continuing need to advance the development of reversible resistance-change materials. One aspect of this involves tuning the composition (e.g., stoichiometry) of a resistance-change material. The changed stoichiometry portion provides advantages for the resulting memory cell such as reduced resistivity which can reduce power consumption.

The resistance-change material can be provide as a metal oxide layer which includes an initial stoichiometry portion and a changed stoichiometry portion. The initial stoichiometry portion refers to a portion having an initial stoichiometry, e.g., an initial ratio of elements (atoms or molecules) in a compound. The changed stoichiometry portion refers to a portion having a changed stoichiometry, e.g., a changed ratio of elements, different than the initial ratio. One approach is to incorporate a plasma reduction process with a deposition process. The plasma reduction process causes a portion of the metal oxide layer to become metal-rich. However, the conditions (e.g., temperature) which optimize the plasma reduction process may differ from the conditions which optimize the deposition process. Moreover, in the case of a vertically extending metal oxide layer, the range of available deposition processes is limited and it is difficult to make the plasma reduction process uniform along the length/height of the metal oxide layer.

Techniques provided herein address the above and other issues. In one approach, a stoichiometric metal oxide layer of a memory cell on a wafer is deposited while the wafer is in a first chamber which is optimized for the deposition. Subsequently, the wafer is positioned in a second chamber which is optimized for a plasma reduction process which causes a portion of the metal oxide layer to have a changed stoichiometry. Furthermore, in the case of a vertically extending metal oxide layer, the conditions in the second chamber (e.g., RF power, pressure and bias of the wafer) can time to form the changed stoichiometry portion with a uniform thickness along the length/height of the metal oxide layer.

Figure 1A:
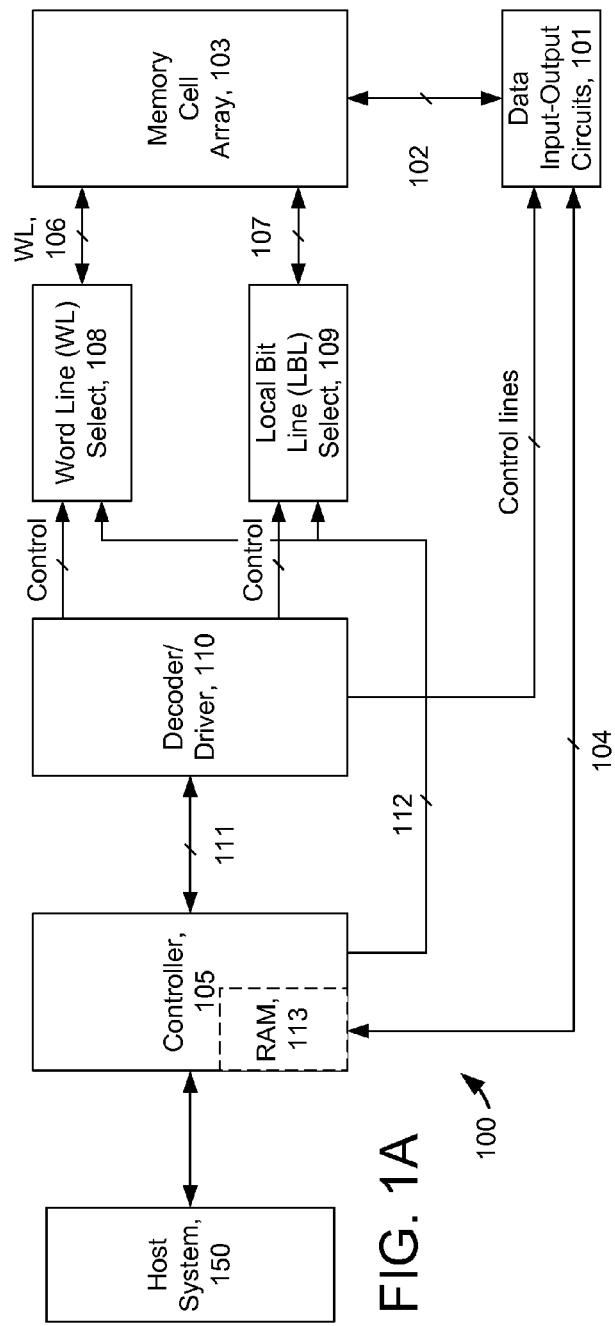
FIG. 1A is a schematic block diagram of a non-volatile memory system connected to a host system.

FIG. 1A is a schematic block diagram of a non-volatile memory system 100 connected to a host system 150. Data input-output circuits 101 are connected to provide and receive analog electrical signals in parallel over global bit lines (GBLs) 102, also referred to as metal lines herein. The signals represent data stored in addressed memory cells in a memory cell array 103. The data input-output circuits may include sense amplifiers for converting these electrical signals into digital data values during reading. The digital values are then sent over data input-output lines 104 to a controller 105. Conversely, data to be programmed into the memory array is sent by the controller to the data input-output circuits, which program the data into the addressed memory cells by placing appropriate voltages on the global bit lines. For binary operation, one voltage level is typically placed on a global bit line to represent a binary "1" and another voltage level to represent a binary "0". The memory cells are addressed for reading or programming by voltages placed on the word lines (WLLs) 106 and row select lines 107 by respective word line select circuits 108 and local bit line select circuits 109. In an example three-dimensional array, the memory cells between a selected word line and any of the local bit lines connected through the select transistors to the global bit lines may be addressed for programming or reading by appropriate voltages being applied through the select circuits 108 and 109.

The select transistors may be provided as vertical channel transistors as described further below.

The controller 105 receives data from and sends data to the host system 150. The controller can include a random access memory (RAM) 113 for temporarily storing this data and associated information. Commands, status signals and addresses of data being read or programmed are also exchanged between the controller and the host. The memory system can operate with various host systems such as personal computers (PCs), laptops and other portable computers, cellular telephones, personal digital assistants (PDAs), digital still cameras, digital movie cameras and portable audio players. The host typically connects to the memory system using a built-in receptacle (for receiving a memory card or flash drive that comprises the memory system) or by a wired or wireless path. Alternatively, the memory system may be built into the host system.

The controller conveys commands received from the host to decoder/driver circuits 110 via command/status line 111. Similarly, status signals are communicated to the controller the from decoder/driver circuits. The decoder/driver circuits 110 can be simple logic circuits, where the controller controls nearly all of the memory operations, or the circuits can include a state machine to control at least some of the repetitive memory operations necessary to carry out given commands. Control signals resulting from decoding commands are applied from the decoder/driver circuits to the word line select circuits 108, local bit line select circuits 109 and data input-output circuits 101. Also connected to the decoder/driver circuits are address lines 112 from the controller that carry physical addresses of memory cells to be accessed within the array 103 in order to carry out a command from the host. The physical addresses correspond to logical addresses received from the host system, where the conversion is made by the controller and/or the decoder/driver circuits. As a result, the local bit line select circuits partially address the designated storage elements within the array by placing appropriate voltages on the control gates of the select transistors to connect selected local bit lines with the global bit lines. The addressing is completed by the decoder/driver circuits applying appropriate voltages to the word lines of the array.

Figure 2:
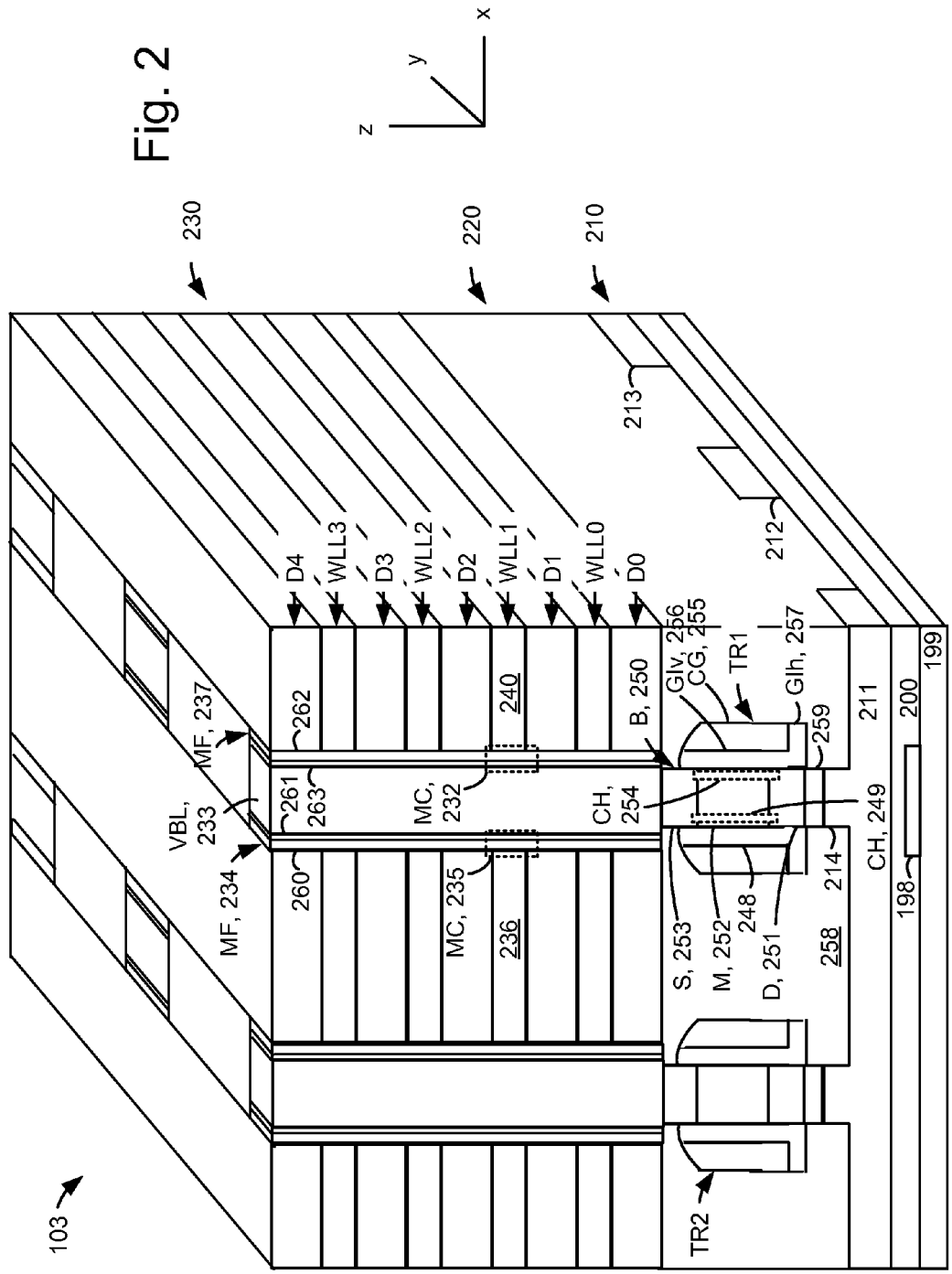
FIG. 2 depicts a perspective view of an example memory array of the non-volatile memory system of FIG. 1A in which a resistance-change material extends vertically.

The memory system of FIG. 1A can be implemented with a three-dimensional memory array such as depicted in FIG. 2, in an example embodiment. Although each of the memory cells in the memory array may be individually addressed to be programmed or read, it is also possible to program or read sets of memory cells in parallel. For example, one row of memory cells on one plane may be programmed and read in parallel. The number of memory cells programmed or read in parallel depends on the number of memory cells connected to the selected word line. In some arrays, the word lines may be segmented so that only a portion of the total number of memory cells connected along their length may be addressed for parallel operation, namely the memory cells connected to a selected one of the segments. In some arrays, the number of memory cells programmed in one operation may be less than the total number of memory cells connected to the selected word line.

Figure 3:
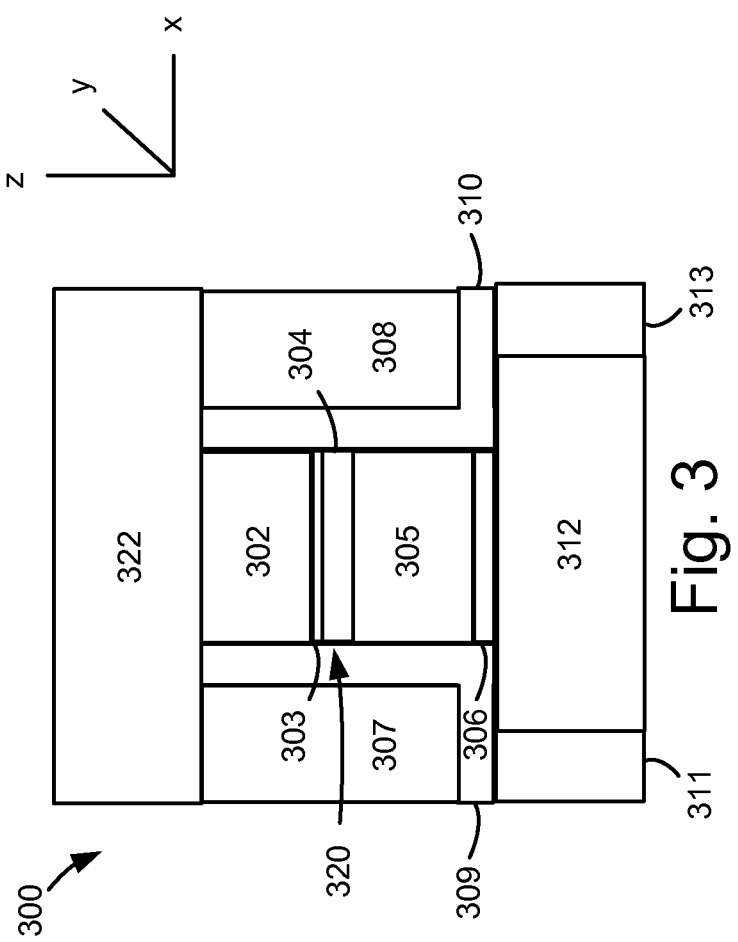
FIG. 3 depicts an example memory cell of the non-volatile memory system of FIG. 1A in which a resistance-change material extends horizontally.

Alternatively, the memory system of FIG. 1A can be implemented with a two-dimensional memory array which comprises memory cells such as depicted in FIG. 3.

Programmed memory cells whose data have become obsolete may be addressed and re-programmed from the states in which they were previously programmed. The starting states can differ among the memory cells being re-programmed in parallel. In some cases, a group of memory cells is reset to a common state before they are re-programmed. For example, the memory cells may be grouped into blocks, where the memory cells of each block are simultaneously reset to a common state, e.g., an erased state, in preparation for subsequently programming them.

The individual blocks of memory cells may be further divided into a plurality of pages of storage elements (memory cells), wherein the memory cells of a page are programmed or read together.

Figure 1B:
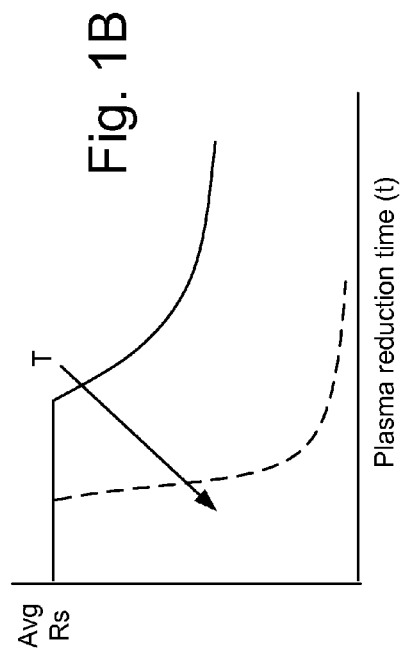
FIG. 1B depicts a reduction in sheet resistance for a metal oxide film as a function of temperature and plasma reduction time.

FIG. 1B depicts a reduction in sheet resistance (Rs) for a metal oxide film as a function of temperature (T) and plasma reduction time (t). As mentioned, the changed stoichiometry portion of a metal oxide layer which is formed by a plasma reduction process has a reduced resistivity compared to the stoichiometric metal oxide. This example shows how the average sheet resistance (ohms/square) (Rs) of a metal oxide film is reduced with increasing plasma reduction time. Rs is initially constant but then decreases relatively quickly over time. The solid line represents a lower temperature such as 350 C and the dashed line represents a higher temperature such as 450 C. Rs decreases sooner and more quickly at the higher temperature. Based on a desired Rs, the plasma reduction time and temperature can be set.

The metal oxide can be binary oxide such as HfO2, TiO2, Al2O3, Ta2O5, NiO/NiO2, ZrO2, GeO2 or SiO2 or a ternary oxide as SrTiO3, HfSiO2, HfAlO2, HfSiON, HfAlON or other doped metal oxide, for instance. Further, the resistance-switching material of a memory cell can include a single metal oxide layer or multiple metal oxide layers of different types. Moreover, a metal oxide layer can be deposited horizontally, such as shown in FIG. 3, or vertically, such as shown in FIG. 2. For a horizontal film, a range of deposition techniques are generally available, including Chemical Vapor Deposition (CVD), Physical Vapor Deposition (PVD), Plasma-Enhanced Chemical Vapor Deposition (PECVD), Atomic Layer Deposition (ALD) or Plasma-Enhanced Atomic Layer Deposition (PEALD). For very thin films, low deposition rate PVD and ALD are viable.

However, for deposition on a vertical wall, the full range of deposition techniques is not available. ALD is a primary enabling technology for depositing metal oxide uniformly on vertical sidewalls to form memory cells in a VBL architecture for 3D memory. Generally, material deposited using ALD may have good insulating properties for devices such as high-k metal gate CMOS, FinFETs and DRAM.

For a ReRAM device, an option is desirable for providing a non-stoichiometric metal oxide, or, generally, for changing the stoichiometry of a non-stoichiometric or stoichiometric metal oxide. A single layer, a bilayer, a multi-layer of different materials, or a multi-layer of one material of different stoichiometric layers can be used. However, it is challenging to use ALD to produce non-stoichiometric film, or to otherwise change the stoichiometry of a film, due to the limited ability to tune the composition of the film. Instead, ALD metal oxide films are generally stoichiometric, amorphous in structure and thermally and chemically stable until the crystallization temperature is reached. One way to modify an as-deposited film surface is to heat the film in a reduction ambient of NH3 to a high temperature such as 900 to 1100 degrees C. However, with the limited thermal budget for devices such as 3D ReRAM, such an elevated temperature will degrade device performance due to material structure changes, transistor junction profile degradation, memory cell stack layers inter-mixing and film stress/delamination.

To change the stoichiometry of a metal oxide film deposited by ALD aat significantly lower temperature, a plasma reduction treatment with H2 (hydrogen) and NH3 (ammonia) reactive gas flow can be applied on as-deposit films. This is effective in reducing a stoichiometric metal oxide film to a desired composition by controlling wafer temperature, plasma radical density and energy, and process duration. This method has advantages for devices such as 3D ReRAM where there is a limited thermal budget. In addition, because it is a surface treatment method, the film composition alteration depth can be controlled to ultra thin dimensions such as monolayers. For a ReRAM device, an ultrathin layer (e.g., 10 to 300 Å) is preferable for low current switching. A metal-rich, metal oxide thin film of tunable resistivity provides opportunities to construct an in-cell resistor, to adjust electrical contact barrier height, to modify charge trapping density and to perform interface engineering.

For a commercial application of these techniques, the plasma reduction process can be integrated into one ALD or PEALD process module, where a plasma treatment alternately can be applied to every deposition cycle or every n-cycles within one process chamber or between two chambers on the same cluster system without a vacuum break. This approach can significantly increase the controllability of material composition, the interface quality between layers in a multilayer stack and the wafer throughput in a high volume non-volatile memory manufacturing environment.

For example, in a VBL (Vertical Bit Line) ReRAM, a thin metal oxide read-write (RW) film can be obtained using ALD. However, it is difficult for ALD to have different compositions when bilayers and other multilayers are required, such as Ta0x/Ta2O5 or HfO2/Hf bilayers. Plasma reduction can enable such a bilayer structure by depositing a single layer of Ta2O5, or HfO2, with ALD and then reducing the top or outer layer into TaOx (x<2.5), or HfOx (x<2) and metallic Hf. The composition and thickness of the reduced layer can be controlled and optimized for device performance adjusting by the plasma reduction process.

A number of advantages can be achieved. The metal oxide can be made metal-rich (oxygen deficient) instead of oxygen-rich. The modified metal oxide can alter the RW layer switching characteristics. As the plasma reduction continues, the metal oxide transitions from an insulator to a semi-insulator to a conductor so that it resistivity can be tuned. The metal oxide can be used as an in-cell resistor within a RW stack. This can save extra film deposition steps and conserve line spacing, especially for small pitch arrays such as in VBL devices. The techniques also allow modifying a conductor-dielectric contact electrical barrier height for MIM RW and selector. The techniques are useful to restore the surface condition of electrode metal and refractory metal, such as Hf, Ta, W, Ni, TiN, TaN and WN, by converting a native oxide layer and process-induced oxide layer to their bulk properties. For a VBL device, the RW cell electrode is formed by plasma etch and post etch ash/clean. Further, since the exposed electrode surface which is subjected to harsh process conditions can be damaged and oxidized, the plasma reduction process can further clean the electrode surface and recover the surface from oxidation.

Moreover, the properties and thickness of the treated layer, once established, can be inline monitored inside a semiconductor fabrication plant using a blanket monitor wafer. This avoids the need for expensive materials analysis techniques such as Transmission Electron Microscopy (TEM) and Secondary Ion Mass Spectrometry (SIMS). Also, the metal oxide deposition and reduction treatments can be integrated in the same ALD module to maximize treatment effectiveness, improve wafer throughput and reduce cost for high volume production.

FIG. 2 depicts a perspective view of an example memory array of the non-volatile memory system of FIG. 1A in which a resistance-change material extends vertically. The memory array includes a dielectric 200 on a substrate 199. Logic circuits 198 may also be formed on the substrate, under the memory array. A metal layer 210 is on the substrate and comprises metal lines 211, 212 and 213. The dielectric provides a barrier between the metal lines and the substrate (e.g., Si) which can be biased.

A transistor layer 220 on the metal layer includes example transistors TR1 and TR2. A stack 230 on the transistor layer include alternating dielectric layers D0-D4 (e.g., TEOS or SiO2) and conductive word line layers WLL0-WLL3 (e.g., metal, metal silicide or doped polysilicon). Holes are etched in the stack and filled with a memory film (e.g., memory film MF 234 and 237) and a conductive material which forms vertical bit lines (e.g., VBL 233). The memory film can comprise a resistance-switching material which can be configured in two or more resistance states to represent corresponding data states. A memory cell is formed in a portion of a memory film which is adjacent to a word line layer. The word line layer acts as one electrode of the memory cell and the vertical bit line acts as another electrode of the memory cell. For example, a memory cell MC 232 is formed in a portion of the MF 237 adjacent to the WLL1 portion 240, with electrodes provided by the WLL1 portion 240 (as a first electrode) and by VBL 233 (as a second electrode). Another example memory cell MC 235 is formed in a portion of the MF 234 adjacent to the WLL1 portion 236, with electrodes provided by the WLL1 portion 236 (as a first electrode) and by VBL 233 (as a second electrode).

In an example implementation, the memory film 234 comprises an initial stoichiometry portion 260 and a changed stoichiometry portion 261, and the memory film 237 comprises an initial stoichiometry portion 262 and a changed stoichiometry portion 263.

The example memory array includes six vertical bit lines in two rows, with three VBLs per row. Each word line layer includes three memory cells in each row, for a total of twenty four memory cells in the array. A bottom of each vertical bit line is connected to the top of a respective vertical channel transistor. Two transistors are depicted in cross-section along the x-z plane. Each transistor may include a body (comprising a source, middle or channel portion and a drain), and one or more control gates proximate to the body and separated from the body by a gate insulator material. A bottom of each transistor may be connected (directly or indirectly via another material such as an adhesion layer) to a horizontal metal line such as a global bit line. An adhesion layer may be provided between the metal line and the body of the transistor. For example, the transistor TR1 includes a body B 250 having a drain region D 251, a middle portion M 252 above the drain region and a source region S 253 above the middle portion. The transistor also include a control gate CG 255 which is spaced apart from the body by a vertical portion GIv 256 of a gate insulator material. The gate insulator material may also include a horizontal portion GIh 257.

In one option, the control gates are straight (rail shaped), and two straight control gates extend in the y direction and are used to control one row of transistors. For example, one control gate 248 can provide a channel 249 in one half of the body of the transistor to allow the metal line 211 to communicate with the VBL. Another control gate 255 can provide a channel 254 in the other half of the body of the transistor to allow the metal line to communicate with the VBL.

In another option, the gate insulator material surrounds the body of the transistor, e.g., in a circular shape (in the x-y plane). In this case, the control gates 248 and 255 are part of the same control gate and the channels 249 and 254 are part of the same channel.

An insulation 258 may surround the transistors in the transistor layer 220.

An example adhesion layer 259 may be provided between a pedestal region 214 of the metal line 211 and the drain 251 of the transistor TR1. The channel 254 and/or 249 may be formed in the body when a sufficient gate-to-drain voltage is applied to the transistor.

A Cartesian coordinate system which is used in various figures indicates a vertical direction (z) and lateral directions x and y.

The memory film can be of various types. Example memory films include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN). Metal oxides are of particular interest.

The material may be formed in an initial state, for example, a relatively low-resistance state. Upon application of sufficient voltage, the material switches to a stable high-resistance state which is maintained after the voltage is removed. In some cases, the resistance switching is reversible such that subsequent application of an appropriate current or voltage can serve to return the material to a stable low-resistance state which is maintained after the voltage or current is removed. This conversion can be repeated many times. For some materials, the initial state is high-resistance rather than low-resistance. A set process may refer to switching the material from high to low resistance, while a reset process may refer to switching the material from low to high resistance. The set and reset processes can be considered to be programming processes which change the resistance state. In other cases, the resistance switching is irreversible.

FIG. 3 depicts an example memory cell 300 of the non-volatile memory system of FIG. 1A in which a resistance-change material extends horizontally. The memory cell is provided by a resistance-switching material such as metal oxide 320 comprising an initial stoichiometry portion 304 and a changed stoichiometry portion 303. A conductive barrier 302 (upper conductive material) such as TiN separates the metal oxide from a top metal line 322 such as tungsten (W) which extends in the x direction. A TiN layer 306 and a conductive barrier 305 (upper conductive material) such as n+Si or TiN separate the metal oxide from a bottom metal line 312 such as tungsten (W) which extends in the y direction. The memory cell therefore has a metal-insulator-metal (MIM) configuration. Further, the cell has a planar configuration in which the metal oxide 320 extends horizontally, in an x-y plane. A cross-point array may be formed of many parallel top metal lines and parallel bottom conductive lines (e.g., word lines or bit lines), where memory cells are provided at the intersections of the top and bottom conductive lines. This can be a two-dimensional configuration. Another approach involves multiple layers of memory cells in a three-dimensional configuration. Insulation regions 307, 308, 311 and 313 such as SiO2 are provided, along with SiN regions 309 and 310. Fabrication details are discussed further below.

The conductive barrier 305 acts as a first electrode of the cell and the conductive barrier 302 acts as a second electrode of the cell. The top and bottom metal lines could also be considered to be electrodes of the cell.

Figure 4A:
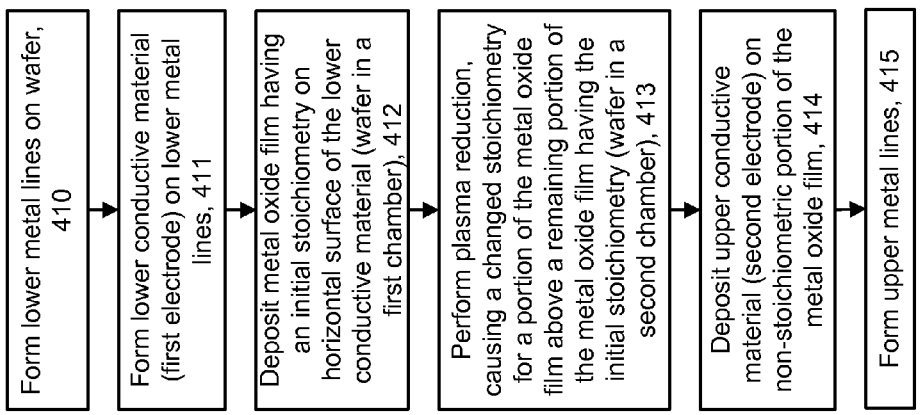
FIG. 4A depicts an example process for fabricating a memory cell with a resistance-change material comprising an initial stoichiometry portion and a changed stoichiometry portion.

FIG. 4A depicts an example process for fabricating a memory cell with a resistance-change material comprising an initial stoichiometry portion and a changed stoichiometry portion. Step 400 involves depositing a metal oxide film having an initial, as-deposited stoichiometry on a first electrode using atomic layer deposition in a first chamber under first process conditions. For example, the metal oxide film can be stoichiometric or non-stoichiometric. Non-stoichiometric in this case refers to metal-rich or metal poor. Step 401 involves performing plasma reduction, causing a portion of the metal oxide film to have a changed stoichiometry relative to the initial stoichiometry. This portion is adjacent to (e.g., in contact with) a remaining portion of the metal oxide film which has the initial stoichiometry. This step can be carried out in a second chamber under second process conditions. The plasma process is thus separate from the atomic layer deposition.

For example, the portion of the metal oxide film having the changed stoichiometry can be non-stoichiometric while the remaining portion of the metal oxide film is stoichiometric. Or, the portion of the metal oxide film having the changed stoichiometry and the remaining portion of the metal oxide film can both be non-stoichiometric. For example, the portion of the metal oxide film having the changed stoichiometry may be more non-stoichiometric (e.g., more metal-rich) than the remaining portion of the metal oxide film. Step 405 involves forming a second electrode adjacent to (e.g., in contact with) the portion of the metal oxide film having the changed stoichiometry. Additional details are discussed further below.

Figure 4B:
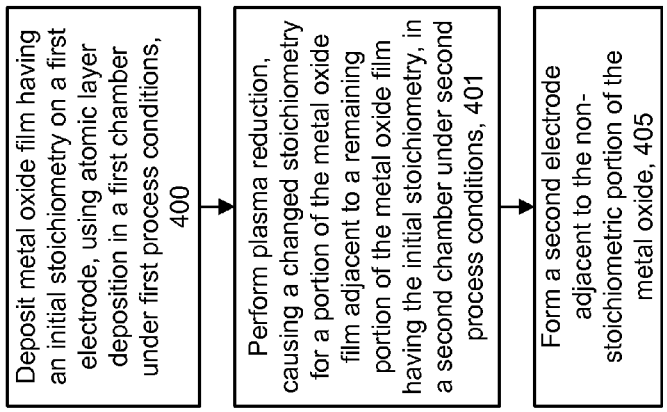
FIG. 4B depicts an example implementation of the process of FIG. 4A for fabricating the memory cell of FIG. 3.

FIG. 4B depicts an example implementation of the process of FIG. 4A for fabricating the memory cell of FIG. 3. As mentioned, this memory cell has a horizontal metal oxide layer. Step 410 includes forming lower metal lines (e.g., line 312 in FIG. 3) on a wafer, e.g., a semiconductor substrate (e.g., substrate 199 in FIG. 2). Step 411 comprises forming a lower conductive material (e.g., conductive barrier 305 in FIG. 3) as a first electrode on the lower metal lines. Step 412 includes depositing a metal oxide film (e.g., metal oxide 320 in FIG. 3) having an initial stoichiometry on a horizontal surface of the lower conductive material, while the wafer is in a first chamber under a first set of conditions. Step 413 includes performing a plasma reduction on the metal oxide, causing a portion of the metal oxide film to have a changed stoichiometry relative to the initial stoichiometry (e.g., changed stoichiometry portion 303 in FIG. 3). This portion of the metal oxide film above a remaining portion of the metal oxide film which has the initial stoichiometry (e.g., initial stoichiometry portion 304 in FIG. 3), while the wafer is in a second chamber under a second set of conditions which can differ from the first set of conditions. Step 414 involves depositing an upper conductive material (e.g., conductive barrier 302 in FIG. 3) as a second electrode on the portion of the metal oxide film having the changed stoichiometry. Step 415 involves forming the upper metal lines on the upper conductive material. The materials which are formed on one another may be in contact with one another. See FIG. 5A and 5B for further details.

FIG. 4C depicts an example implementation of the process of FIG. 4A for fabricating the memory cell of FIG. 2. As mentioned, this memory cell has a vertical metal oxide layer. The vertical layer may extend in the z direction, substantially orthogonal to a plane of the wafer, for instance. However, the term "vertical" can also encompass variations from the z direction. Step 420 includes forming global bit lines (e.g., metal lines 211, 212 and 213 in FIG. 2) on a wafer. Step 421 involves forming vertical channel transistors (e.g., transistors TR1 and TR2 in FIG. 2) on the global bit lines. Step 422 involves forming a stack (e.g., stack 230 in FIG. 2) comprising alternating conductive (first electrode) portions (e.g., word line layers WLL0-WLL3 in FIG. 2) and dielectric portions (e.g., dielectric layers D0-D4 in FIG. 2) above the vertical channel transistors. Step 423 involves forming vertically extending holes in the stack. A hole refers to, e.g., any cutout region of the stack of any shape. The cutout region can extend from the top of the stack in the z direction and have a cross section in the x-y direction which is circular, square, rectangular or other shape (in X-Y direction), for instance. The hole can be, for example, a cylindrical hole, a rectangular hole or a trench.

Step 424 involves optionally performing plasma reduction to clean the walls of the alternating conductive and dielectric portions in the holes, before depositing the stoichiometric metal oxide film. This could involve moving the wafer to a different chamber.

Step 425 includes depositing a metal oxide film having an initial stoichiometry (e.g., memory films 234 and 237 in FIG. 2) on walls of the alternating conductive and dielectric portions in the holes, while the wafer is in a first chamber under a first set of conditions. Step 426 includes performing plasma reduction, thereby causing a changed stoichiometry for a portion (e.g., portions 261 and 263 in FIG. 2) of the metal oxide film which is adjacent to a remaining portion (e.g., portions 260 and 262 in FIG. 2) of the metal oxide film having the initial stoichiometry, while the wafer is in a second chamber under a second set of conditions. Step 427 involves depositing vertical bit line material (second electrode) (e.g., VBL 233 in FIG. 2) in the holes, adjacent to the portion of the metal oxide film having the changed stoichiometry. See FIG. 6A to 6C for further details.

FIG. 4D depicts an example implementation of step 426 of FIG. 4C for performing plasma reduction. Step 430 begins a plasma generation process. Step 431 involves varying one or more conditions (e.g., RF power, pressure or wafer bias) to target the reaction of hydrogen ions in the plasma with different portions of metal oxide film along a height (z direction) of the hole, such as along a height of a sidewall of the holes. The changes to the conditions can increase the mean free path of the plasma so that the plasma can more easily travel along the height of the hole to reach portions of the metal oxide film which are closer to the bottom of the hole. Step 432 ends the plasma generation. See FIG. 8A-8F for further details.

FIG. 5A depicts a fabrication stage of the memory cell of FIG. 3 in which a stoichiometric metal oxide film 320 is deposited on a lower conductive material, consistent with steps 410 to 412 of FIG. 4B. Since the metal oxide film extends horizontally, it can be deposited using a blanket deposition.

FIG. 5B depicts a fabrication stage of the memory cell of FIG. 3 in which a portion 303 of the metal oxide film 320 having a changed stoichiometry is formed above a remaining portion 304 of the metal oxide film 320 having the initial stoichiometry, consistent with step 413 of FIG. 4B. A plasma reduction process is performed which changes a stoichiometry of metal oxide. See FIG. 7B for further details. The memory cell depicted in FIG. 3 is subsequently formed.

FIG. 6A depicts a fabrication stage of the memory cell 235 of FIG. 2 in which a metal oxide film 234 having an initial stoichiometry is deposited on walls of alternating conductive and dielectric portions in holes in the stack, consistent with step 425 of FIG. 4C. For simplicity, only one of the conductive portions is shown. In the memory cell 235, the WLL1 portion 236 is depicted as an example first electrode, and a portion of the memory film 234 (e.g., metal oxide) is the resistance-switching material. Additional memory cells are provided along spaced-apart regions of the memory film 234, adjacent to each word line layer portion. The memory film has a thickness th.

FIG. 6B depicts a fabrication stage of the memory cell 235 of FIG. 2 in which a changed stoichiometry portion 261 of the metal oxide film 234 is formed adjacent to a remaining initial stoichiometry portion 260 of the metal oxide film, consistent with step 426 of FIG. 4C. The changed stoichiometry portion 261 has a thickness th_ns=5-300 Å and the initial stoichiometry portion has a thickness th_s=5-300 Å, for instance. Typically, the total thickness of the memory stack is: th=th_ns+ th_s.

FIG. 6C depicts a fabrication stage of the memory cell 235 of FIG. 2 in which a vertical bit line material 233 (as a second electrode) is deposited adjacent to the changed stoichiometry portion 261 of the metal oxide film 234, consistent with step 427 of FIG. 4C.

Figure 7A:
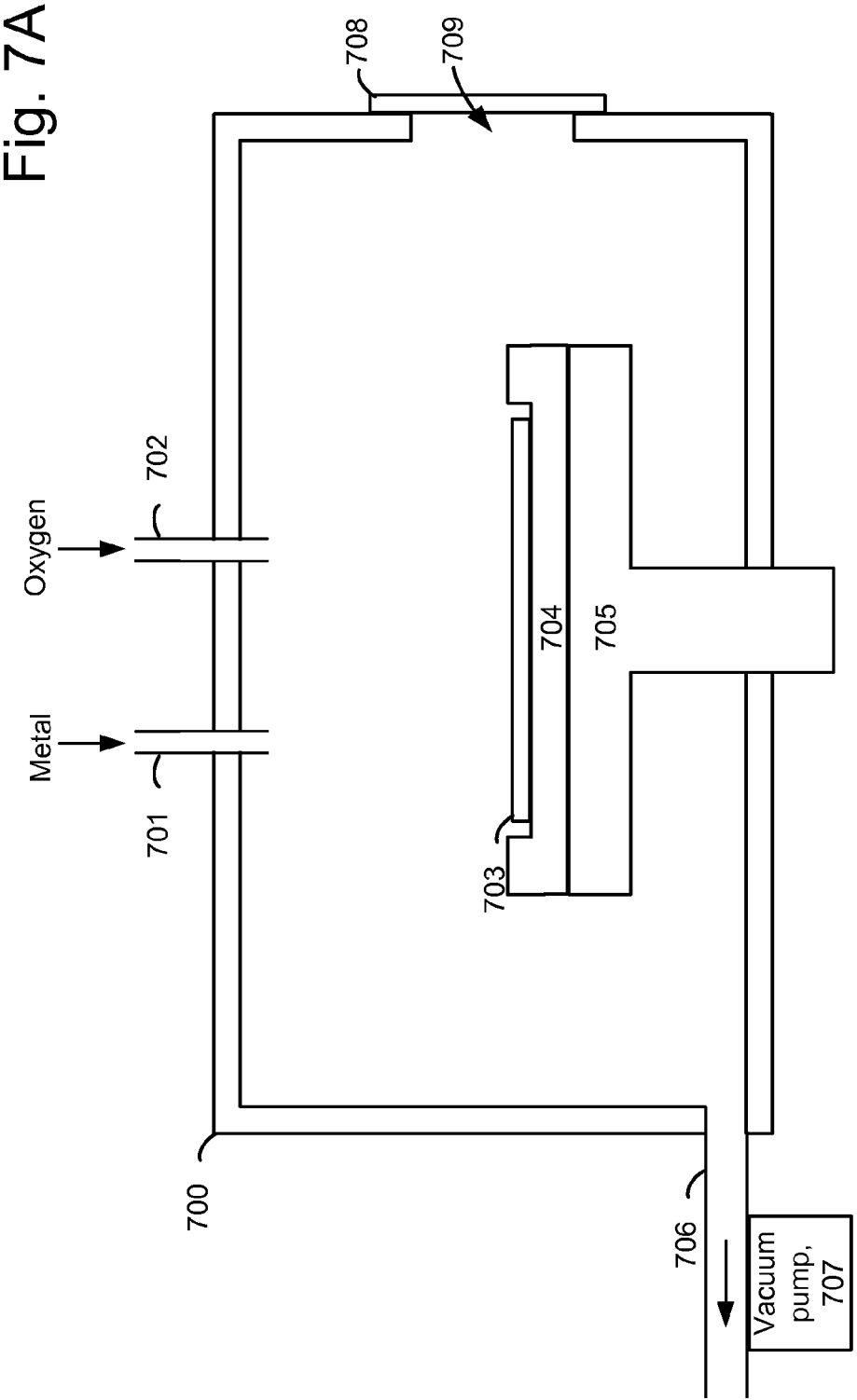
FIG. 7A depicts a chamber in which a stoichiometric metal oxide film is deposited in a memory device using ALD, consistent with step 400 of FIG. 4A, step 412 of FIG. 4B and step 425 of FIG. 4C.

FIG. 7A depicts a chamber in which a stoichiometric metal oxide film is deposited in a memory device using ALD, consistent with step 400 of FIG. 4A, step 412 of FIG. 4B and step 425 of FIG. 4C. The chamber 700 includes an inlet 701 for a metal, an inlet 702 for oxygen and an outlet 706 or exhaust connected to a vacuum pump 707 which provides a vacuum in the chamber. A wafer 703 is held in a top plate 704 on a heating block 705. The heating block can be used to set the temperature of the wafer and the chamber. An example temperature for ALD is 200 to 600 degrees C. The wafer can be loaded and unloaded via an opening 709 and a gate valve 708.

ALD is a cyclic process in which the reacting gases are delivered separately to react with the surface instead of with each other. Each reaction is self-terminating, depositing a single layer at a time, independent of gas flow distribution or gas transport into substrate features. ALD thus provides a layer-by-layer growth mechanism. For example, in one cycle, metal can be introduced in the chamber which coats the wafer. Oxygen is then introduced which reacts with the metal on the wafer to provide a layer of metal oxide. This process is repeated in additional cycles until a metal oxide film with a desired overall thickness is created.

As mentioned, ALD is suitable for depositing a film on horizontal or vertical surfaces. In another approach, PVD is used. PVD is suitable for depositing a film on horizontal. With PVD, the reacting gases mix in the chamber and continuously react to form a film. For example, the metal and the oxygen can be concurrently supplied in the chamber when they react to provide metal oxide. The metal oxide coats the wafer until a film with a desired overall thickness is created.

FIG. 7B depicts a chamber in which a plasma reduction process is performed on a stoichiometric metal oxide film, consistent with step 401 of FIG. 4A, step 413 of FIG. 4B and step 426 of FIG. 4C. The chamber 720 includes an inlet 721 for a reacting gas and an outlet 729 or exhaust connected to a vacuum pump 730 which provides a vacuum in the chamber. The wafer 703 is held in a top plate 727 on a heating block 728. The heating block can be used to set the temperature of the wafer and the chamber. An example temperature for plasma reduction is from room temperature (20 degrees C.) up to 600 degrees C. depending on the binding energy of a particular metal oxide material. The wafer can be loaded and unloaded via an opening 733 and a gate valve 732.

The reacting gas enters the chamber via a showerhead 724. The showerhead has many holes facing the wafer which uniformly inject the gas into the chamber toward the wafer. The showerhead is electrically connected to an RF circuit 722 via an electrode 723. The wafer is electrically connected to an RF circuit 731 via the top plate 727 and the heating block 728 which form another electrode.

The power from the RF circuit 722 is used to generate a plasma cloud 725 in the chamber. A plasma is a gas in which a significant percentage of the atoms or molecules are ionized. The reacting gas can comprises hydrogen. For example, hydrogen can be provided as H2 molecules or in a compound such as ammonia (NH3). The power supplied by the RF circuit 722 causes the H2 to dissociate and form: a) H neutral and b) H+ ions (ionized hydrogen). This power controls the density of the plasma, e.g., the number of available ions. The H+ ions react with the surface of the stoichiometric metal oxide to reduce the amount of oxygen in the metal oxide. A portion of the metal oxide thus becomes oxygen-poor or metal-rich. For example, a stoichiometric metal oxide which can be written as Me_n1Ox_n2 has n1 atoms of a metal and n2 atoms of oxygen, where n1 and n2 are positive integers (1 or more) and n2>n1. A non-stoichiometric, metal-rich, metal oxide which can be written as MeOx_n3 has one atom of a metal and n3 atoms of oxygen, where n3 is a fraction which is less than n2/n1 and is not an integer. For example, stoichiometric hafnium oxide is HfO2 and metal-rich hafnium oxide is HfOx, where x<2. Stoichiometric aluminum oxide is AL2O3 and metal-rich aluminum oxide is ALOx, where x<1.5.

The electrode connected to the substrate provides a bias on the substrate that pulls the charged ions toward the substrate. This bias thus affects the energy of the H+ ions. Other factors such as pressure also affect the energy.

FIG. 8A depicts an uneven formation of the changed stoichiometry portions of a metal oxide film which can result during a plasma reduction process of step 426 of FIG. 4C. For example, the thickness th_s1 of the changed stoichiometry layer near the top of the hole (H) can be greater than the thickness th_s2 of the changed stoichiometry layer near the bottom of the hole (H). This can be undesirable since the resistance will be greater for the memory film at the bottom of the hole compared to the top. This situation occurs due to the difficulty faced by the ions in reaching the bottom of the hole. The ions are represented by circles in the hole, such as example ion 800, and the directions the ions move are represented by the arrows attached to the circles. There are fewer ions at the bottom of the hole than at the top in this case due to the increasing number of collisions and recombinations as the ions move toward the bottom of the hole.

Generally, it is desirable for the ions to reach the metal oxide throughout the hole before colliding. A collision can result in the ion recombining with another particle, e.g., an electron so that the ion is no longer available to react with the metal oxide. The mean free path (MFP) of the ions is a measure of a distance the ions travel before colliding with another particle. A larger MFP means the ions travel further before colliding. The MFP can be represented by: $\lambda = RT/\sqrt{2}\pi^2 NP$, where R is the universal gas constant, T is temperature, d is the diameter of the particle, N is Avagadro's number and P is pressure. The MFP can be increased by increasing temperature, although it is typically difficult to increase temperature rapidly in a chamber. The MFP can also be increased by decreasing pressure. Further, based on the ideal gas equation $P=\rho RT/M$, where $\rho$ is density and M is the molar mass, pressure is proportional to density. As a result, the MFP can be increased by decreasing density. The density of the ions in turn is lower when a lower power is provided by the RF circuit 722. As a result, the MFP can be increased by decreasing the pressure. The MFP can also be increased by providing a higher magnitude for the bias of the electrode connected to the substrate. This higher magnitude bias causes the ion movement to be more directional toward the substrate.

As mentioned, the factors affecting the MFP can be changed during the plasma reduction of the metal oxide to target different portions of metal oxide film along a height of the hole. That is, the factors can be set during a portion of the plasma reduction time to improve the likelihood that the ions will reach the metal oxide at the bottom of the hole. See FIG. 8C to 8F. Generally, a lower MFP results in the ions reacting more with the portion of the metal oxide at the top of the hole and a higher MFP results in more ions reaching to the portion of the metal oxide at the bottom of the hole.

FIG. 8B depicts an even formation of the changed stoichiometry portion of a metal oxide film which results during the plasma reduction process of step 425 of FIG. 4C by varying the process conditions as set forth in step 431 of FIG. 4D. Here, the thickness th_s and the density of ions is approximately uniform along the length/height of the metal oxide film. The varying of the process conditions improves the uniformity.

FIG. 8C is a plot showing a variation of MFP as a function of plasma reduction time, where process conditions are varied consistent with step 431 of FIG. 4D. The total plasma reduction time is t0 to t2, including an earlier period of t0 to t1 and a later period of t1 to t2. The total plasma reduction time depends, e.g., on the desired thickness of the changed stoichiometry portion of the metal oxide. The total plasma reduction time can be, e.g., between one minute and thirty minutes.

In this example, the MFP is higher during the later period. Another approach is to use the higher MFP during the earlier period. In one example (solid line), the MFP is increased gradually and continuously. In another example (dashed line), the MFP is set to one of two discrete levels. Two or more discrete levels can be used. Also, the MFP can vary in more complex ways such as by being increased, decreased and increased, or decreased, increased and decreased, and so forth. Further, the MFP can be changed by changing one or more factors at the same time or at separate times. The relationship between MFP and time can be linear or non-linear.

FIG. 8D is a plot showing a variation of reduction plasma radical density as a function of RF power, consistent with step 431 of FIG. 4D. The reduction plasma radical density can be increased by increasing the RF power of the electrode which generates the plasma. The plasma reduction process supplies an RF power to provide a plasma, the ions in the plasma travel in the chamber and enter the hole, where the ions react with an exposed surface of the metal oxide film, and RF power is changed between two or more levels during the plasma reduction process. For example, one level can be used in the earlier period and another level can be used in the later period. Or, the level can be varied continuously. The relationship between MFP and RF power can be linear or non-linear.

FIG. 8E is a plot showing a variation of mean free path as a function of pressure, consistent with step 431 of FIG. 4D. The MFP can be increased by reducing the pressure in the chamber. Here, a pressure in the chamber is changed between two or more levels during the plasma reduction process. For example, one level can be used in the earlier period and another level can be used in the later period. Or, the level can be varied continuously. The relationship between MFP and pressure can be linear or non-linear.

FIG. 8F is a plot showing a variation of reduction plasma radical energy as a function of a bias on a wafer, consistent with step 431 of FIG. 4D. The MFP can be increased by increasing the magnitude of the bias on the wafer. Here, a bias is provided to the wafer during the plasma reduction process, and the bias is changed between two or more levels during the plasma reduction process. For example, one level can be used in the earlier period and another level can be used in the later period. Or, the level can be varied continuously. The relationship between radical energy and the bias can be linear or non-linear.

Figure 9:
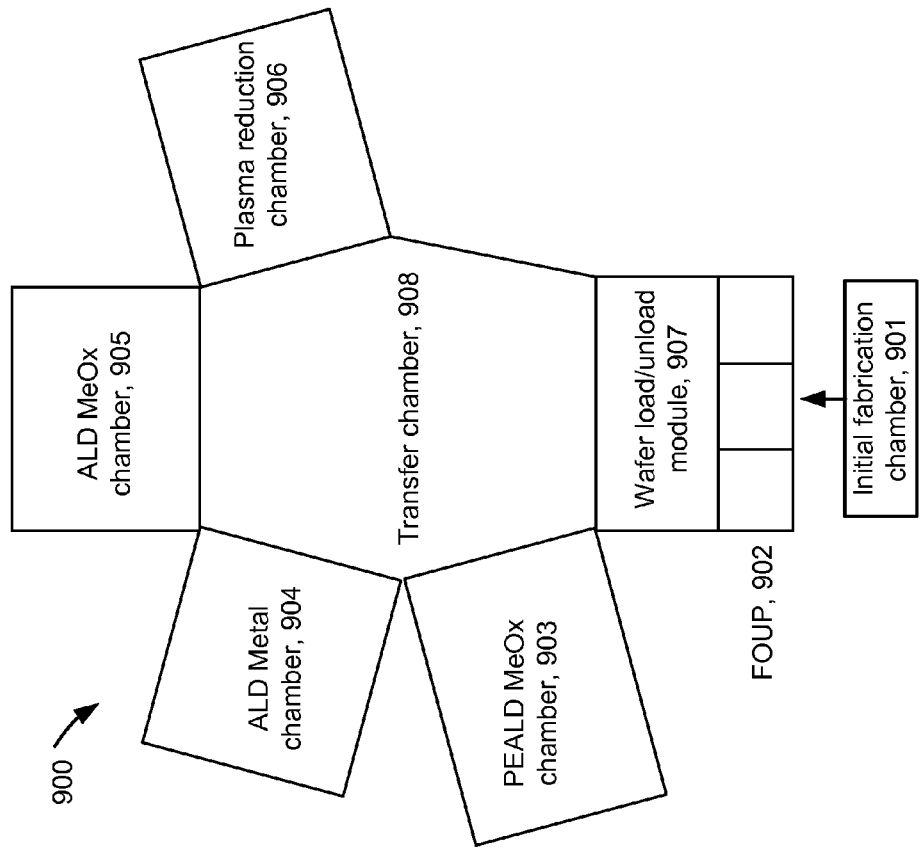
FIG. 9 depicts a semiconductor processing apparatus which includes different chambers for depositing stoichiometric metal oxide film and for performing a plasma reduction process for the stoichiometric metal oxide film.

FIG. 9 depicts a semiconductor processing apparatus 900 which includes different chambers for depositing stoichiometric metal oxide film and for performing a plasma reduction process for the stoichiometric metal oxide film.

An initial fabrication chamber 901 is used to provide the structure on the wafer which does not include the metal oxide. The wafer is then received at a Front Opening Unified Pod (FOUP) 902. This is an enclosure which holds the wafer in a protective environment and allows it to be transferred to the processing chambers. The wafer is then provided to a wafer load/unload module 907 and to a transfer chamber 908. The wafer can be transferred between a number of different chambers via the transfer chamber.

For example, the metal oxide can be deposited at an ALD MeOx chamber 905 or a PEALD MeOx chamber 903. Subsequently, the wafer is moved to the plasma reduction chamber 906 where the changed stoichiometry metal oxide is formed. Additional processing is performed, such as at the ALD metal chamber 904, where metal lines which connected to the electrodes for the cells are formed.

The depositing of the metal oxide can be performed in a first chamber while the first chamber is at a first temperature which is optimized for the depositing, and the plasma reduction process can be performed in a second chamber while the second chamber is at a second temperature, different than the first temperature.

As an example, a range of optimal temperatures for depositing metal oxide by ALD is 200 to 600 degrees C., while a range of optimal temperatures for the plasma reduction process may be 200 to 600 degrees C.

This approach decouples the ALD and plasma processes so that they can be done at different temperatures. If only one chamber was used for both processes, it would take a long time to change the temperature so this is impractical although possible. The optimum temperature for ALD for a metal oxide film depends on the type of metal and factors such as crystallization and defect formation. Different films have different requirements, so it is useful to be able to optimize the temperature freely for different films. The optimum temperature for the plasma treatment also depends on the type of metal and factors such as the configuration of the chamber.

The plasma reduction process can be performed in an atomic layer deposition chamber to treat the metal oxide film in-situ immediately after a film deposition cycle or between film deposition cycles.

Accordingly, it can be seen that, in one embodiment, a method for fabricating a semiconductor device comprises: depositing a metal oxide film on a first electrode using atomic layer deposition, the metal oxide film as deposited has an initial stoichiometry, the first electrode and the metal oxide film are carried on a wafer; after completing the depositing of the metal oxide film, performing a plasma reduction process, separate from the atomic layer deposition, causing a portion of the metal oxide film to have a changed stoichiometry relative to the initial stoichiometry, the portion of the metal oxide film having the changed stoichiometry is adjacent to a remaining portion of the metal oxide film which has the initial stoichiometry; and forming a second electrode adjacent to the metal oxide film having the changed stoichiometry.

In another embodiment, a method for fabricating a memory device comprises: providing a wafer in a first chamber, a first electrode is carried on the wafer; depositing a metal oxide film on the first electrode using atomic layer deposition while the wafer is in the first chamber, the metal oxide film has an initial stoichiometry as deposited on the first electrode; after the depositing of the metal oxide film, moving the wafer to a second chamber; performing a plasma reduction process while the wafer is in the second chamber, the plasma reduction process causes a portion of the metal oxide film to have a changed stoichiometry relative to the initial stoichiometry, the portion of the metal oxide film having the changed stoichiometry is adjacent to a remaining portion of the metal oxide film which has the initial stoichiometric; and forming a second electrode adjacent to the portion of the metal oxide film having the changed stoichiometry.

In another embodiment, a method for fabricating a memory device, comprises: forming a stack on a wafer, the stack comprising alternating conductive and dielectric portions; etching a hole through the stack, the etching exposes sidewalls of the alternating conductive and dielectric portions; depositing a metal oxide film in the hole, the metal oxide film extends continuously along a sidewall of the hole, from a bottom of the stack to a top of the stack; converting a portion of the metal oxide film from stoichiometric metal oxide to non-stoichiometric metal oxide; and forming a conductive material in the hole, the conductive material extends continuously along the sidewall of the hole, from the bottom of the stack to the top of the stack.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A method for fabricating a memory device, comprising:
   depositing a metal oxide film on a first electrode using atomic layer deposition, the metal oxide film as deposited has an initial stoichiometry, the first electrode and the metal oxide film are carried on a wafer;
   after completing the depositing of the metal oxide film, performing a plasma reduction process, separate from the atomic layer deposition, causing a portion of the metal oxide film to have a changed stoichiometry relative to the initial stoichiometry, the portion of the metal oxide film having the changed stoichiometry is adjacent to a remaining portion of the metal oxide film which has the initial stoichiometry; and
   forming a second electrode adjacent to the metal oxide film having the changed stoichiometry.

2. The method of claim 1, wherein:
   the metal oxide film as deposited is stoichiometric; and
   the portion of the metal oxide film having the changed stoichiometry is non-stoichiometric.

3. The method of claim 1, wherein:
   the depositing is performed while the wafer is in a first chamber at a first temperature;
   the wafer is moved to a second chamber after the depositing is performed; and
   the plasma reduction process is performed while the wafer is in the second chamber at a second temperature, different than the first temperature.

4. The method of claim 3, wherein:
   the first temperature is optimized for the atomic layer deposition; and
   the second temperature is optimized for the plasma reduction process.

5. The method of claim 1, wherein:
   the first electrode is one electrode among a plurality of electrodes formed in a stack which is carried on the wafer, the plurality of electrodes are spaced apart from one another along a hole in the stack, the hole extending vertically in the stack; and
   the second electrode, the portion of the metal oxide film having the changed stoichiometry and the remaining portion of the metal oxide film which remains stoichiometric, extend continuously along a height of the hole.

6. The method of claim 5, wherein:
   the wafer is in a chamber during the plasma reduction process; and
   a pressure in the chamber is changed between two or more levels during the plasma reduction process.

7. The method of claim 5, wherein:
   the plasma reduction process supplies an RF power to provide a plasma, the plasma enters the hole to react with a surface of the metal oxide film; and
   the RF power is changed between two or more levels during the plasma reduction process.

8. The method of claim 5, wherein the metal oxide film is deposited on a sidewall of the first electrode. the method further comprising:
   prior to the depositing of the metal oxide film on the first electrode, performing a plasma reduction process which cleans a sidewall of the first electrode.

9. The method of claim 5, wherein:
   a bias is provided to the wafer during the plasma reduction process; and
   the bias is changed between two or more levels during the plasma reduction process.

10. The method of claim 1, wherein:
    the plasma reduction process provides a plasma comprising hydrogen ions, the hydrogen ions react with the metal oxide film.

11. The method of claim 1, wherein:
    the portion of the metal oxide film having the changed stoichiometry is metal-rich and oxygen-poor.

12. The method of claim 1, wherein:
    the metal oxide film is deposited on a horizontal surface or a sidewall of the first electrode.

13. The method of claim 1, wherein:
    the plasma reduction process is performed in an atomic layer deposition chamber to treat the metal oxide film in-situ immediately after a film deposition cycle or between film deposition cycles.

14. A method for fabricating a memory device, comprising:
    providing a wafer in a first chamber, a first electrode is carried on the wafer;
    depositing a metal oxide film on the first electrode using atomic layer deposition while the wafer is in the first chamber, the metal oxide film has an initial stoichiometry as deposited on the first electrode;
    after the depositing of the metal oxide film, moving the wafer to a second chamber;
    performing a plasma reduction process while the wafer is in the second chamber, the plasma reduction process causes a portion of the metal oxide film to have a changed stoichiometry relative to the initial stoichiometry, the portion of the metal oxide film having the changed stoichiometry is adjacent to a remaining portion of the metal oxide film which has the initial stoichiometric; and
    forming a second electrode adjacent to the portion of the metal oxide film having the changed stoichiometry.

15. The method of claim 14, wherein:
    the depositing is performed while the first chamber is at a first temperature; and the plasma reduction process is performed while the second chamber is at a second temperature, different than the first temperature.

16. The method of claim 14, wherein:
the portion of the metal oxide film having the changed stoichiometry is metal-rich and oxygen-poor.

17. A method for fabricating a memory device, comprising:
forming a stack on a wafer, the stack comprising alternating conductive and dielectric portions;
etching a hole through the stack, the etching exposes sidewalls of the alternating conductive and dielectric portions;
depositing a metal oxide film in the hole, the metal oxide film extends continuously along a sidewall of the hole, from a bottom of the stack to a top of the stack;
converting a portion of the metal oxide film from stoichiometric metal oxide to non-stoichiometric metal oxide; and
forming a conductive material in the hole, the conductive material extends continuously along the sidewall of the hole, from the bottom of the stack to the top of the stack.

18. The method of claim 17, wherein:
each conductive portion is a respective first electrode for a respective resistance-switching memory cell of a plurality of resistance-switching memory cells; and
the conductive material is a second electrode which is common to the plurality of resistance-switching memory cells.

19. The method of claim 17, wherein:
the depositing and the converting are performed in different respective processing chambers of a semiconductor processing apparatus.

\* \* \* \* \*